(12) United States Patent
Tung et al.

(10) Patent No.: US 6,433,595 B1
(45) Date of Patent: Aug. 13, 2002

(54) METHOD OF SYSTEM CIRCUIT DESIGN AND CIRCUITRY FOR HIGH SPEED DATA COMMUNICATION

(75) Inventors: John C. Tung; Minghao Zhang, both of Cupertino, CA (US)

(73) Assignee: Qantec Communication, Inc., Cupertino, CA (US)

( * ) Notice: Subject to any disclaimer, the term of this patent is extended or adjusted under 35 U.S.C. 154(b) by 0 days.

(21) Appl. No.: 09/947,643

(22) Filed: Sep. 5, 2001

(51) Int. Cl.[7] .............................................. H03K 21/00
(52) U.S. Cl. ....................................... 327/115; 327/218
(58) Field of Search ......................... 327/113–115, 117, 327/200, 201, 208, 210–215, 218, 219; 377/47

(56) References Cited

U.S. PATENT DOCUMENTS 5,945,858 A * 8/1999 Sato ............................ 327/115
6,163,181 A * 12/2000 Nishiyama ................... 327/115
6,166,571 A * 12/2000 Wang .......................... 327/115
6,249,157 B1 * 6/2001 Nakura et al. ............... 327/115
6,285,262 B1 * 9/2001 Kuriyama .................... 327/115

* cited by examiner

*Primary Examiner*—My-Trang Nuton
(74) *Attorney, Agent, or Firm*—Chi Ping Chang; Pacific Law Group LLP

(57) ABSTRACT

A method of designing a system of electronic circuit is presented. With this method the circuit parameters of the components of the individual functional building blocks of the system are systematically adjusted to minimize the deteriorating effect resulting from system-level interactions among these functional building blocks. In one embodiment, the method is applied to a CMOS IC that is a Divide-by-16 divider where the functional building blocks are four Dividing by-2 dividers. The resulting improvement of output signal ripple from each devided stage is graphically presented. In another embodiment, the method is applied to another CMOS IC that is a Bang Bang Phase Detector where the functional building blocks are three Master Slave D-Type Flip Flops. The resulting improvement of output signal ripple is also graphically presented.

21 Claims, 9 Drawing Sheets

Remark: CLK = Logic Inversion of CLK, etc.

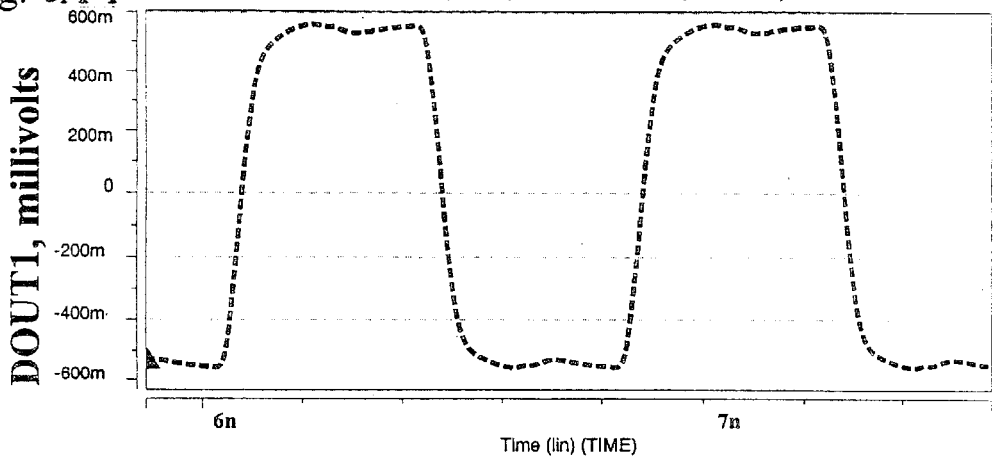
Fig. 3A-1 TYPICAL PRACTICE: f(CLK) = 2.50 GHz, f(DOUT1) = 1.25 GHz
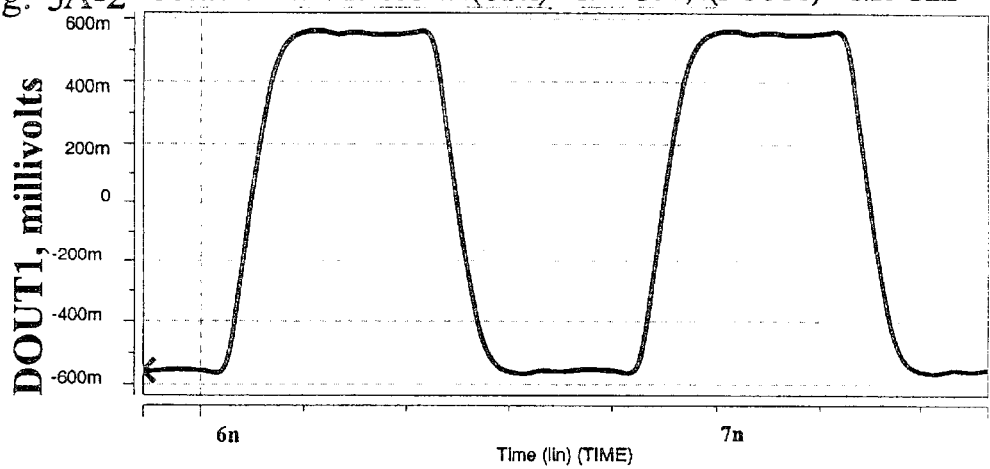
Fig. 3A-2 CURRENT INVENTION: f(CLK) = 2.50 GHz, f(DOUT1) = 1.25 GHz
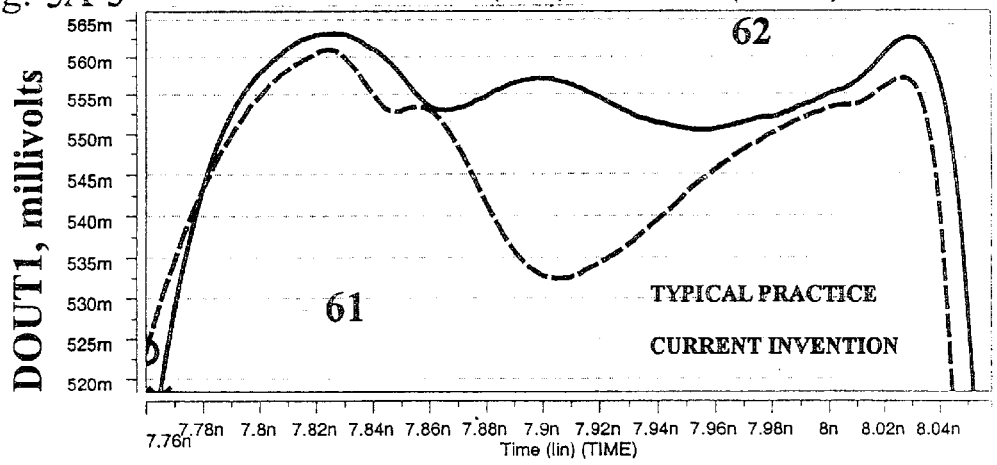
Fig. 3A-3 ZOOMED COMPARISON: f(CLK) = 2.50 GHz, f(DOUT1) = 1.25 GHz Fig. 3B-1 TYPICAL PRACTICE: f(CLK) = 2.50 GHz, f(DOUT2) = 0.625 GHz
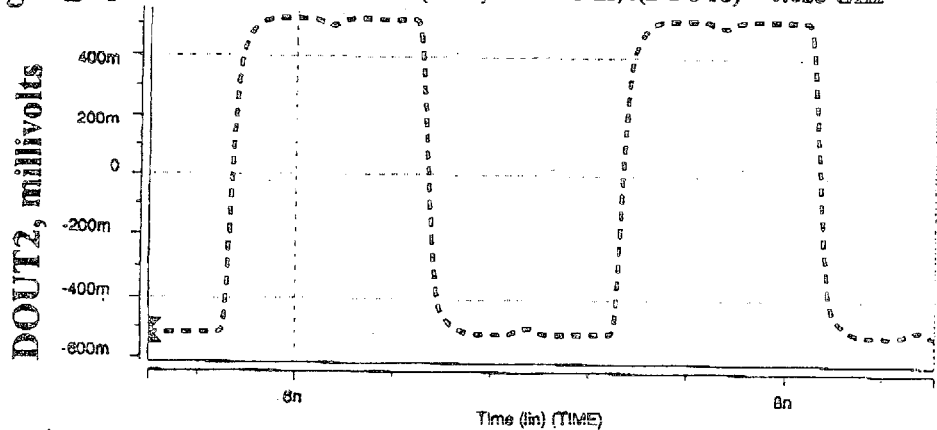
Fig. 3B-2 CURRENT INVENTION: f(CLK) = 2.50 GHz, f(DOUT2) = 0.625 GHz
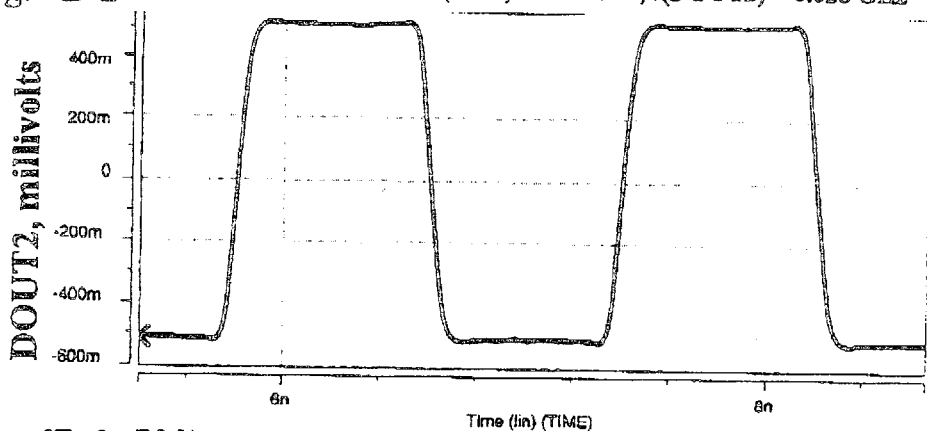
Fig. 3B-3 ZOOMED COMPARISON: f(CLK) = 2.50 GHz, f(DOUT2) = 0.625 GHz
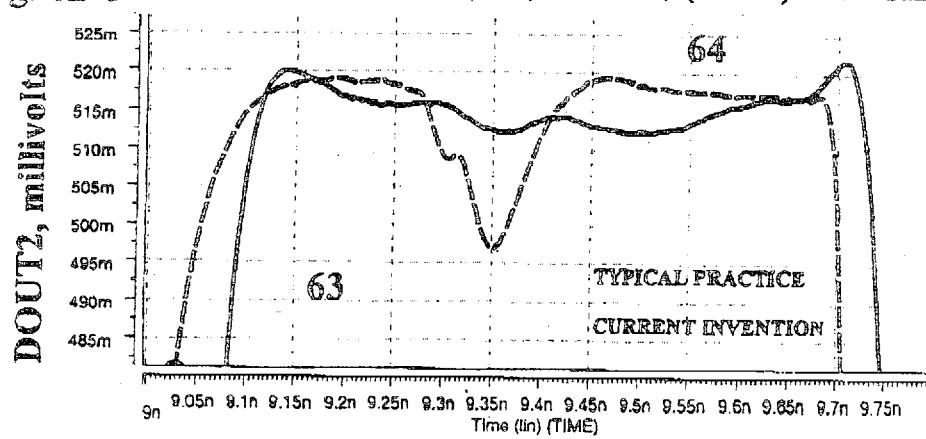

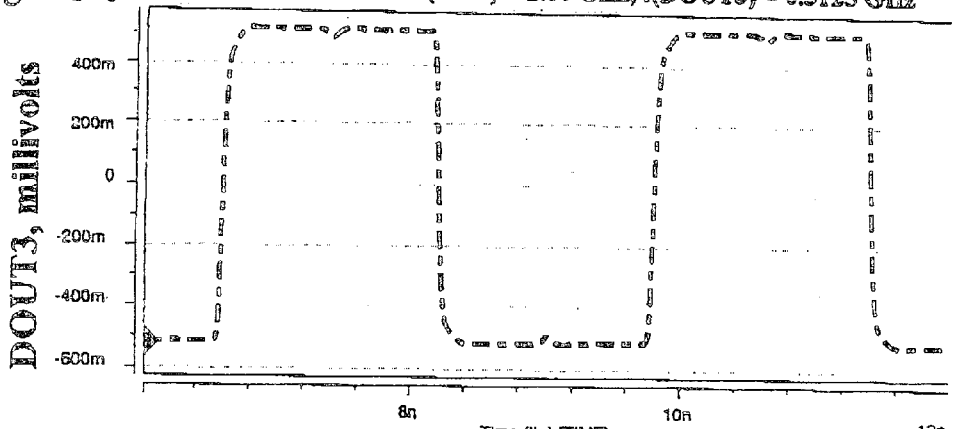
Fig. 3C-1  TYPICAL PRACTICE: f(CLK) = 2.50 GHz, f(DOUT3) = 0.3125 GHz
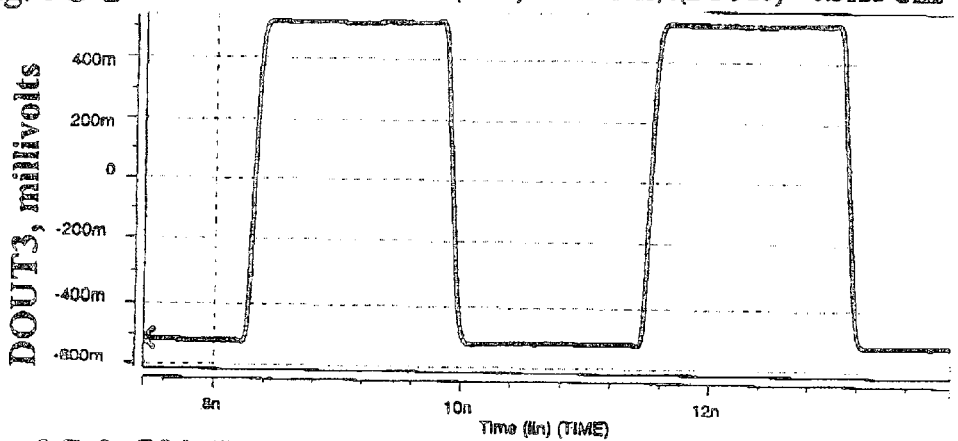
Fig. 3C-2  CURRENT INVENTION: f(CLK) = 2.50 GHz, f(DOUT3) = 0.3125 GHz
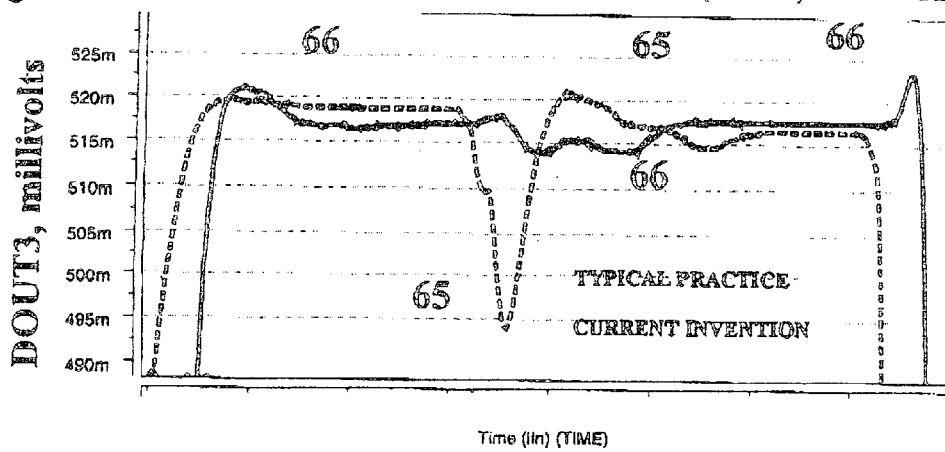
Fig. 3C-3  ZOOMED COMPARISON: f(CLK) = 2.50 GHz, f(DOUT3) = 0.3125 GHz

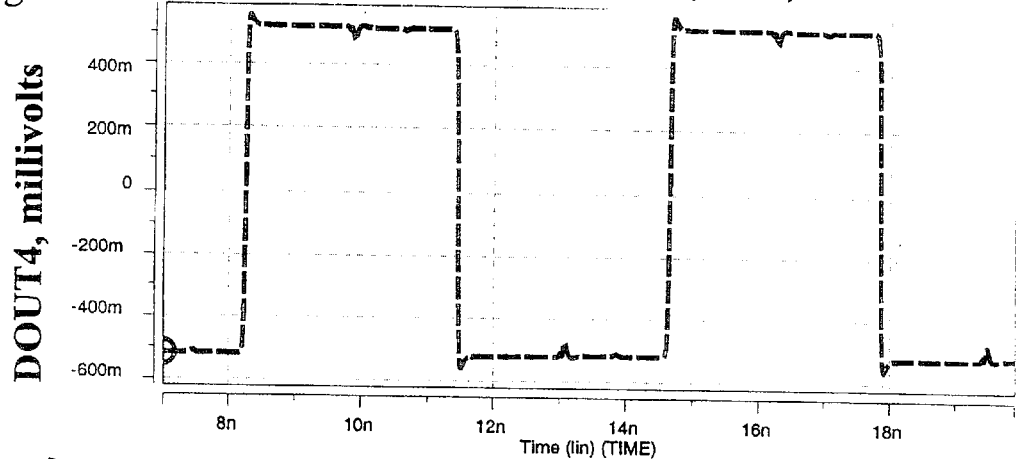
Fig. 3D-1  TYPICAL PRACTICE: f(CLK) = 2.50 GHz, f(DOUT3) = 0.155 GHz
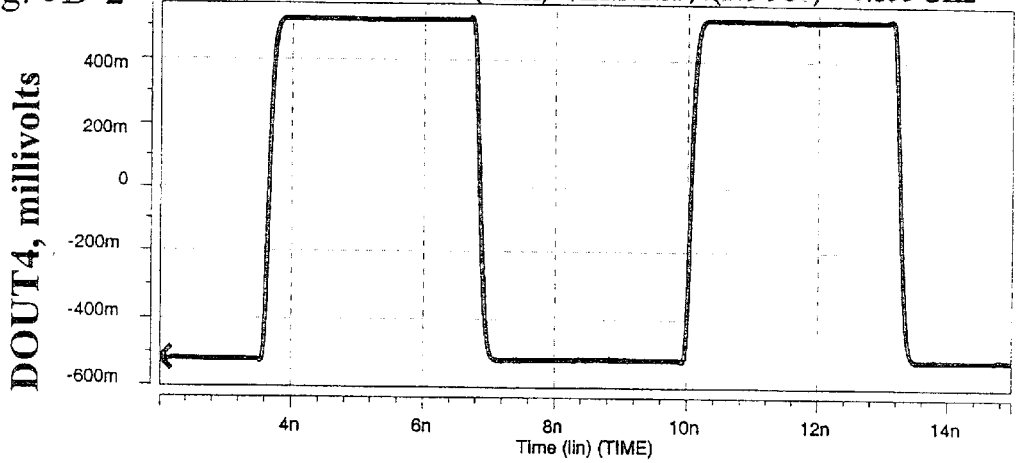
Fig. 3D-2  CURRENT INVENTION: f(CLK) = 2.50 GHz, f(DOUT3) = 0.155 GHz
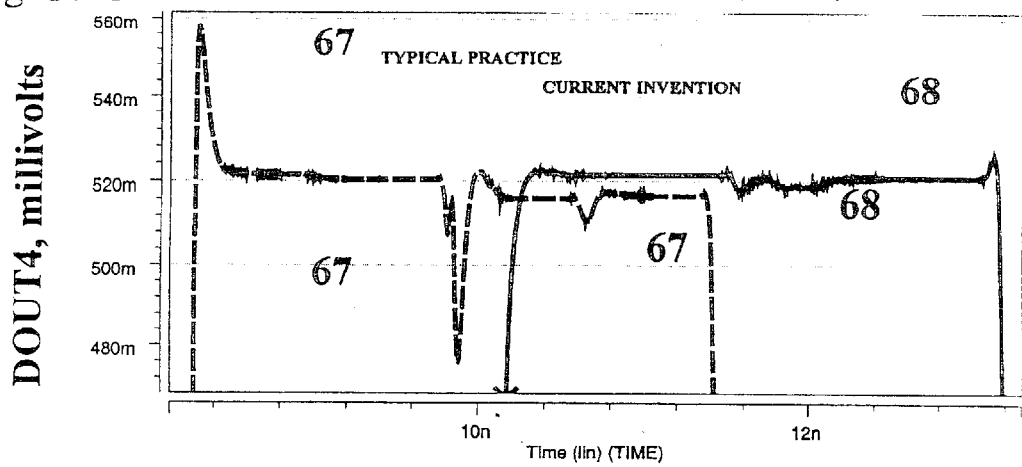
Fig. 3D-3  ZOOMED COMPARISON: f(CLK) = 2.50 GHz, f(DOUT3) = 0.155 GHz

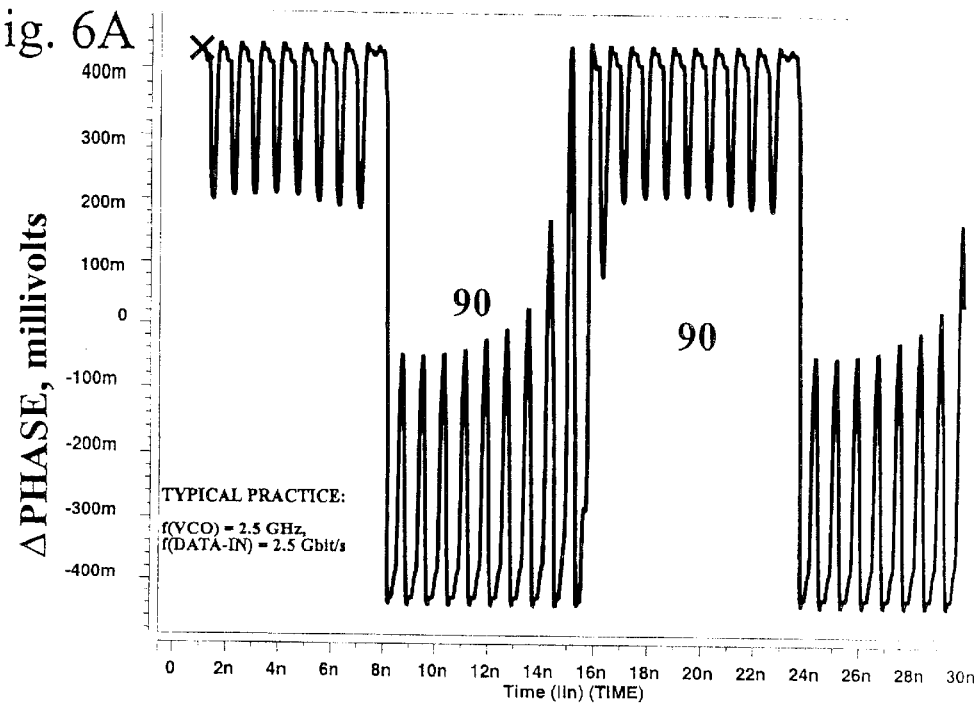
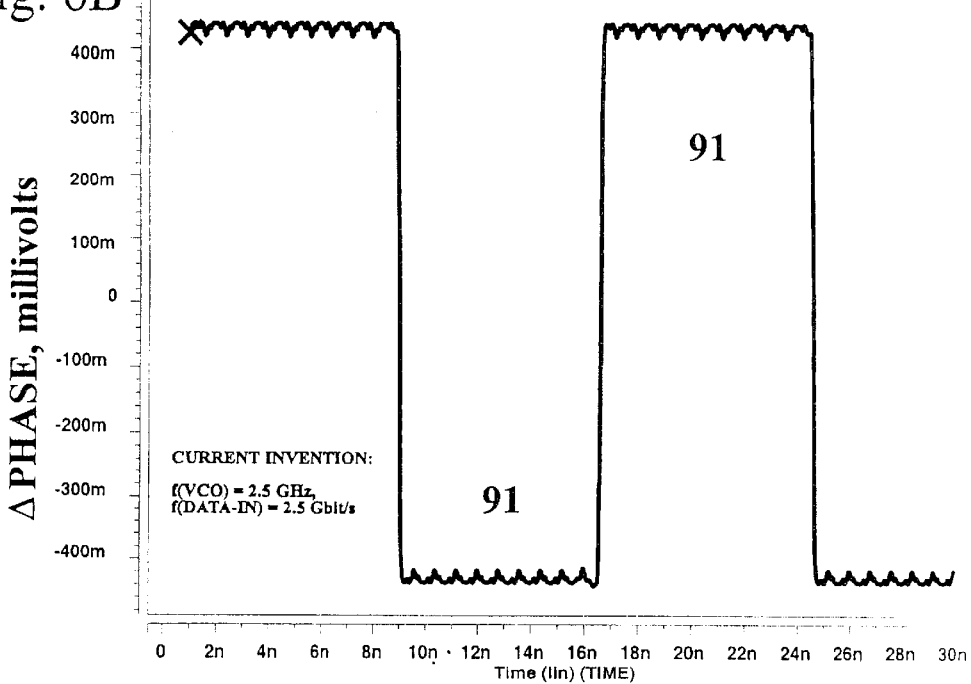

ary of CMOS Integrated Circuits (IC) that is capable of moving data up to a speed of 10 Gbit/Sec when implemented on Silicon with a standard 0.18 µm wafer process. Thus, its direct applications include a variety of subsystem and system functions such as Master Slave D-type Flip Flop (MS-DFF), Divider, Bang Bang Phase Detector (BBPD), Frequency Detection (FD), Phase and Frequency Detection (PFD), Voltage Controlled Oscillator (VCO) and Phase Locked Loop (PLL) in an optical switch IC for data communication.

BACKGROUND OF THE INVENTION

Optical Fiber has been used in voice and data communication for some time now due to its high bandwidth and excellent signal quality resulting from its immunity to electromagnetic interference. The inherent optical data rate from a modulated single-mode laser beam travelling through an optical fiber is expected to well exceed 1000 Gbit/sec.

However, short of a completely optical communication system, the practically realizable bandwidth of fiber optical communication systems has been limited by the need of signal conversion between optical and electrical domain and the associated electronics hardware. Meanwhile, the usage of CMOS ICs has reached maturity in the electronics industry due to their advantage of low manufacturing cost, low operating power consumption, low supply voltage requirement while providing moderate speed in digital switching applications and fairly good circuit density. Because of these advantages, the fiber optical communication industry has been attempting to use the CMOS technology as the preferred electronics hardware base to act as a switch for the optical signal as well. Unfortunately, due to the traditional speed limitation inherent in CMOS switches, previous attempts have been unsuccessful in creating an optical switch with a data rate of 10 Gbit/sec.

In addition, past attempts in identifying a modified CMOS wafer process to achieve the same goal have resulted in poor functional characteristics such as excessive signal ripple, poor waveform jittering and the tendency of the operating IC to overheat quickly. For instance, the article "A 10-Gb/s CMOS Clock and Data Recovery Circuit with a Half-Rate Linear Phase Detector" by Savoj and Razavi, published in IEEE Journal of Solid State Circuits, VOL. 36, NO. 5, May 2001, cited the possibility of creating a large ripple on the control line of the oscillator and hence high jitter in a BBPD of the oscillator and hence high jitter in a BBPD around such a high data rate. Other technologies have been tried as well, with various degrees of success, in an attempt to achieve the desired speed. These include using materials other than pure Silicon such as Silicon Germanium (SiGe), Gallium Arsenide (GaAs), Indium Phosphide (InP) or using a hybrid device architecture for the IC such as the combination of Bipolar and CMOS (BiCMOS), etc. Unfortunately these technologies all suffer from the same major drawback of requiring much higher manufacturing cost in terms of either high raw materials cost or high wafer processing cost with associated low yield.

The problem of high manufacturing cost is crucial, as it tends to discourage or otherwise delay the deployment and use of these components, which in turn directly affects the growth and potential of the optical networking market. A direct impact to the consumer community is, due to this speed bottleneck, the failure to provide for the proper broadband requirement necessary for the delivery of web video and interactive TV in a multimedia environment. Thus, such inherent desire for broadband communication of the consumer community can only be met by realizing a "low cost" optical network for multimedia communication wherein an optical switch can be designed and made using standard, high volume, and low cost IC manufacturing processes.

SUMMARY OF THE INVENTION

The present invention is directed to a new family of CMOS IC and a generic design methodology of designing this new family of CMOS IC that is capable of moving data up to a speed of 10 Gbit/Sec when implemented on Silicon with a standard 0.25 µm wafer process.

The first objective of this invention is to achieve a generic design methodology for a family of CMOS IC with a reduced amount of signal ripple after the respective logic signal levels are reached following a switching operation.

Other objectives, together with the foregoing are attained in the exercise of the invention in the following description and resulting in the embodiment illustrated in the accompanying drawings.

BRIEF DESCRIPTION OF DRAWINGS

The current invention will be better understood and the nature of the objectives set forth above will become apparent when consideration is given to the following detailed description of the preferred embodiments. For clarity of explanation, the detailed description further makes reference to the attached drawings herein:

FIG. 3A compares the output signal ripple between a typical practice and the current invention of a first building block of Divide-by-2 divider for the Divide-by-16 divider in FIG. 2B;

FIG. 3B compares the output signal ripple between a typical practice and the current invention of a second building block of Divide-by-2 divider for the Divide-by-16 divider in FIG. 2B;

FIG. 3C compares the output signal ripple between a typical practice and the current invention of a third building block of Divide-by-2 divider for the Divide-by-16 divider in FIG. 2B;

FIG. 3D compares the output signal ripple between a typical practice and the current invention of a fourth building block of Divide-by-2 divider for the Divide-by-16 divider in FIG. 2B;

FIG. 6A and FIG. 6B compare the output signal ripple between a typical practice and the current invention of the BBPD in FIG. 5B.

DETAILED DESCRIPTION OF THE PREFERRED EMBODIMENTS

In the following detailed description of the present invention, numerous specific details are set forth in order to provide a thorough understanding of the present invention. However, it will become obvious to those skilled in the art that the present invention may be practiced without these specific details. In other instances, well known methods, procedures, components, and circuitry have not been described in detail to avoid unnecessary obscuring aspects of the present invention. The detailed description is presented largely in terms of logic blocks and other symbolic representations that directly or indirectly resemble the operations of signal processing devices coupled to networks. These descriptions and representations are the means used by those experienced or skilled in the art to most effectively convey the substance of their work to others skilled in the art.

Reference herein to "one embodiment" or an "embodiment" means that a particular feature, structure, or characteristics described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations of the invention.

Figure 1:
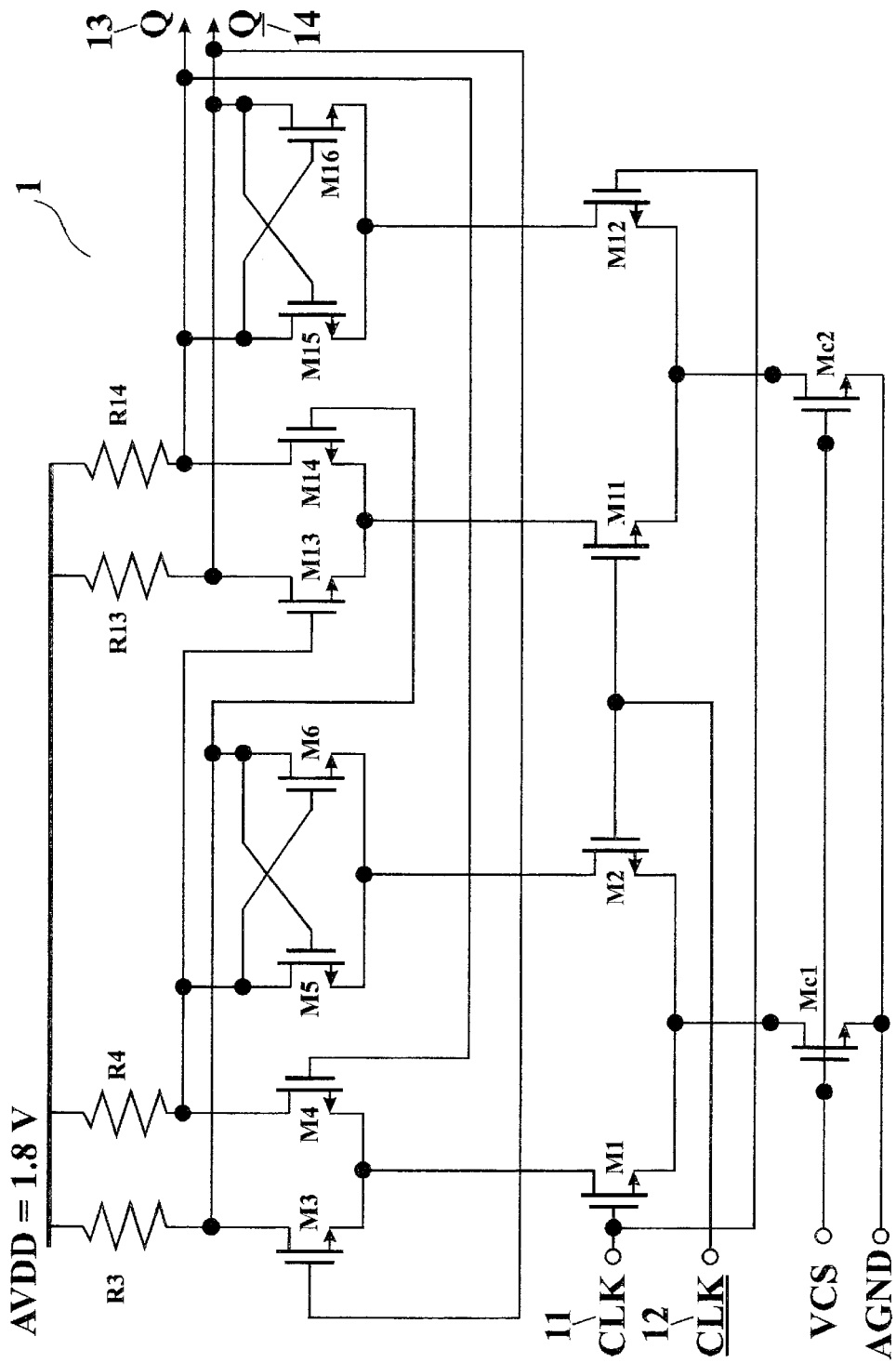
FIG. 1 shows a typical circuit architecture of a Divide-by-2 divider with current mode switching.
Figure 2A:
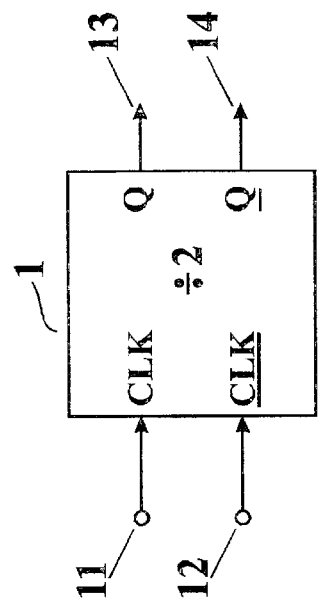
FIG. 2A shows a logic functional block representation for the Divide-by-2 divider shown in FIG. 1.

FIG. 1 shows a typical circuit architecture of a Divide-by-2 DIVIDER 1 with current mode switching. In this exemplary illustration the supply voltage AVDD is shown to be 1.8 Volt although other values could be used just as well, for example 2.5 Volt. Through DIVIDER 1, the frequency of a differential signal between CLK 11 and CLK 12 will be divided in half as the differential signal between Q 13 and Q 14. The various active NMOS transistors are designated as Mc1, Mc2, M1, M2, . . . , and M16. The four pull-up resistors are designated R3, R4, R13 and R14. For those skilled in the art, this type of circuitry is manufacturable with a standard CMOS IC wafer process. In addition, if DIVIDER 1 could be quantitatively designed to provide a high quality signal output at a high CLK frequency, such as 10 GHz for OC-192 communication, then DIVIDER 1 can be used as one of the fundamental building blocks of a low cost optical switch for an optical network. For convenience, the associated logic functional block representation is shown in FIG. 2A.

Figure 2B:
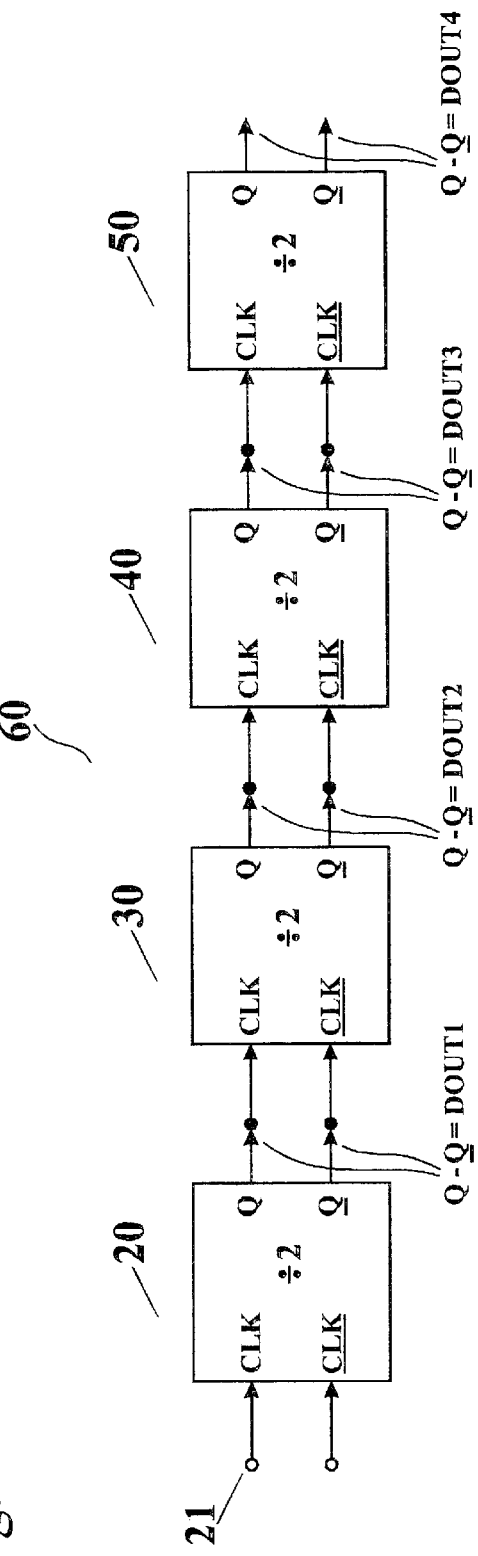
FIG. 2B is a logic functional block diagram of a typical Divide-by-16 divider using the Divide-by-2 divider from FIG. 1.

FIG. 2B is a logic functional block diagram of a typical Divide-by-16 DIVIDER 60 using the Divide-by-2 divider from FIG. 1 as its logic building block. Specifically, the replicated logic building blocks are labeled as DIVIDER 20, DIVIDER 30, DIVIDER 40 and DIVIDER 50. For those skilled in the art, it can be easily seen that the frequency of INPUT CLOCK 21 gets divided by two(2) as differential signal Q-Q=DOUT1 at the output of DIVIDER 20. Likewise, the frequency of INPUT CLOCK 21 gets divided by four(4) as differential signal Q-Q=DOUT2 at the output of DIVIDER 30. The frequency of INPUT CLOCK 21 gets divided by eight(8) as differential signal Q Q-Q=DOUT3 at the output of DIVIDER 40. Finally, the frequency of INPUT CLOCK 21 gets divided by sixteen(16) as differential signal Q-Q=DOUT4 at the output of DIVIDER 50.

However, the just described circuit architecture can be modified with different quantitative designs to realize a new circuit architecture capable of producing quite different levels of output signal quality especially suitable for high CLK frequency for optical communications as will be presently illustrated. It is well known in the art that, at the IC-design level for a given wafer process, the conductance of an MOS transistor is primarily determined by the following parameter:

W/L, where W=channel width and L=channel length.

For convenience, the following parameter is defined:

Electrically Equivalent Channel Geometry (EECG)=W/L.

Given the above definition, TABLE 1A shows a tabulated design comparison between a typical practice and the current invention of a first building block of Divide-by-2 DIVIDER 20 for the Divide-by-16 DIVIDER 60 as shown in FIG. 2B. For example, with typical practice, transistors Mc1 and Mc2 both have an EECG of 120 while transistors M1, M2, M11 and M12 all have an EECG of 108, etc. Likewise, with the current invention, transistors Mc1 and Mc2 both have an EECG of 120 while transistors M1, M2, M11 and M12 all have an EECG of 72, etc.

TABLE 1A

Design of EECG for DIVIDER 20

| TYPICAL PRACTICE | | CURRENT INVENTION | |
|---|---|---|---|
| | EECG | RATIO of EECG | | EECG | RATIO of EECG |
| Mc1 | 120 | 2.22 | Mc1 | 120 | 1.11 |
| Mc2 | 120 | 2.22 | Mc2 | 120 | 1.11 |
| M1 | 108 | 2.00 | M1 | 72 | 0.67 |
| M2 | 108 | 2.00 | M2 | 72 | 0.67 |
| M11 | 108 | 2.00 | M11 | 72 | 0.67 |
| M12 | 108 | 2.00 | M12 | 72 | 0.67 |
| M3 | 54 | 1.00 | M3 | 216 | 2.00 |
| M4 | 54 | 1.00 | M4 | 216 | 2.00 |
| M5 | 54 | 1.00 | M5 | 108 | 1.00 |
| M6 | 54 | 1.00 | M6 | 108 | 1.00 |
| M13 | 54 | 1.00 | M13 | 216 | 2.00 |
| M14 | 54 | 1.00 | M14 | 216 | 2.00 |
| M15 | 54 | 1.00 | M15 | 108 | 1.00 |
| M16 | 54 | 1.00 | M16 | 108 | 1.00 |

For the purpose of explanation, a separate column called "RATIO of EECG" is further defined to be the ratio of EECG between any transistor in question and the transistor located at the bottom of TABLE 1A, M16. Thus, for example, the EECG for transistor M12 under typical practice is 108 and the RATIO of EECG of M12=108/54=2, etc.

In this way, the salient characteristics of a quantitative design can be more easily revealed and this is illustrated respectively in TABLE 1B, TABLE 1C and TABLE 1D where a tabulated design comparison between a typical practice and the current invention of a second, a third and a fourth building block of the Divide-by-16 DIVIDER 60 is respectively shown.

TABLE 1B

Design of EECG for DIVIDER 30

| | TYPICAL PRACTICE | | CURRENT INVENTION | |
|---|---|---|---|---|
| EECG | EECG | RATIO of EECG | EECG | RATIO of EECG |
| Mc1 | 80 | 2.22 | Mc1 | 80 | 0.56 |
| Mc2 | 80 | 2.22 | Mc2 | 80 | 0.56 |
| M1 | 72 | 2.00 | M1 | 54 | 0.38 |
| M2 | 72 | 2.00 | M2 | 54 | 0.38 |
| M11 | 72 | 2.00 | M11 | 54 | 0.38 |
| M12 | 72 | 2.00 | M12 | 54 | 0.38 |
| M3 | 36 | 1.00 | M3 | 180 | 1.25 |
| M4 | 36 | 1.00 | M4 | 180 | 1.25 |
| M5 | 36 | 1.00 | M5 | 144 | 1.00 |
| M6 | 36 | 1.00 | M6 | 144 | 1.00 |
| M13 | 36 | 1.00 | M13 | 180 | 1.25 |
| M14 | 36 | 1.00 | M14 | 180 | 1.25 |
| M15 | 36 | 1.00 | M15 | 144 | 1.00 |
| M16 | 36 | 1.00 | M16 | 144 | 1.00 |

TABLE 1C

Design of EECG for DIVIDER 40

| | TYPICAL PRACTICE | | CURRENT INVENTION | |
|---|---|---|---|---|
| EECG | EECG | RATIO of EECG | EECG | RATIO of EECG |
| Mc1 | 60 | 2.22 | Mc1 | 60 | 0.56 |
| Mc2 | 60 | 2.22 | Mc2 | 60 | 0.56 |
| M1 | 54 | 2.00 | M1 | 54 | 0.50 |
| M2 | 54 | 2.00 | M2 | 54 | 0.50 |
| M11 | 54 | 2.00 | M11 | 54 | 0.50 |
| M12 | 54 | 2.00 | M12 | 54 | 0.50 |
| M3 | 27 | 1.00 | M3 | 162 | 1.50 |
| M4 | 27 | 1.00 | M4 | 162 | 1.50 |
| M5 | 27 | 1.00 | M5 | 108 | 1.00 |
| M6 | 27 | 1.00 | M6 | 108 | 1.00 |
| M13 | 27 | 1.00 | M13 | 162 | 1.50 |
| M14 | 27 | 1.00 | M14 | 162 | 1.50 |
| M15 | 27 | 1.00 | M15 | 108 | 1.00 |
| M16 | 27 | 1.00 | M16 | 108 | 1.00 |

TABLE 1D

Design of EECG for DIVIDER 50

| | TYPICAL PRACTICE | | CURRENT INVENTION | |
|---|---|---|---|---|
| EECG | EECG | RATIO of EECG | EECG | RATIO of EECG |
| Mc1 | 40 | 2.22 | Mc1 | 40 | 0.22 |
| Mc2 | 40 | 2.22 | Mc2 | 40 | 0.22 |
| M1 | 36 | 2.00 | M1 | 36 | 0.20 |
| M2 | 36 | 2.00 | M2 | 36 | 0.20 |
| M11 | 36 | 2.00 | M11 | 36 | 0.20 |
| M12 | 36 | 2.00 | M12 | 36 | 0.20 |
| M3 | 18 | 1.00 | M3 | 144 | 0.80 |
| M4 | 18 | 1.00 | M4 | 144 | 0.80 |
| M5 | 18 | 1.00 | M5 | 180 | 1.00 |
| M6 | 18 | 1.00 | M6 | 180 | 1.00 |
| M13 | 18 | 1.00 | M13 | 144 | 0.80 |
| M14 | 18 | 1.00 | M14 | 144 | 0.80 |

TABLE 1D-continued

Design of EECG for DIVIDER 50

| | TYPICAL PRACTICE | | CURRENT INVENTION | |
|---|---|---|---|---|
| EECG | EECG | RATIO of EECG | EECG | RATIO of EECG |
| M15 | 18 | 1.00 | M15 | 180 | 1.00 |
| M16 | 18 | 1.00 | M16 | 180 | 1.00 |

Referring now to TABLES 2–5, there are further illustrated the difference in quantitative designs of the building blocks between the typical practice and the current invention with respect to the EECG and the ratio of EECG of selected transistors. For example, the EECG and ratio of EECG of transistor Mc1 under typical practice would form the following TABLE-2:

TABLE-2

EECG of transistor Mc1-typical practice

| | DIVIDER 20 | DIVIDER 30 | DIVIDER 40 | DIVIDER 50 |
|---|---|---|---|---|
| EECG | 120 | 80 | 60 | 40 |
| Ratio of EECG | 2.22 | 2.22 | 2.22 | 2.22 |

However, the corresponding EECG and ratio of EECG of transistor Mc1 under the current invention would form the following TABLE-3:

TABLE-3

EECG of transistor Mc1-current invention

| | DIVIDER 20 | DIVIDER 30 | DIVIDER 40 | DIVIDER 50 |
|---|---|---|---|---|
| EECG | 120 | 80 | 60 | 40 |
| Ratio of EECG | 1.11 | 0.56 | 0.56 | 0.22 |

For another example, the EECG and ratio of EECG of transistor M13 under typical practice would form the following TABLE-4:

TABLE-4

EECG of transistor M13-typical practice

| | DIVIDER 20 | DIVIDER 30 | DIVIDER 40 | DIVIDER 50 |
|---|---|---|---|---|
| EECG | 54 | 36 | 27 | 18 |
| Ratio of EECG | 1.00 | 1.00 | 1.00 | 1.00 |

However, the corresponding EECG and ratio of EECG of transistor M13 under the current invention would form the following TABLE-5:

TABLE-5

EECG of transistor M13-current invention

| | DIVIDER 20 | DIVIDER 30 | DIVIDER 40 | DIVIDER 50 |
|---|---|---|---|---|
| EECG | 216 | 180 | 162 | 144 |
| Ratio of EECG | 2.00 | 1.25 | 1.50 | 0.80 |

As revealed by TABLE-2, while there is a general trend of decreasing EECG of transistor Mc1 going from DIVIDER 20 to DIVIDER 50, the respective ratios of EECG, however, remain unchanged throughout DIVIDER 20 to DIVIDER 50, as a single designed value of 2.22 for transistor Mc1. Likewise, TABLE-4 reveals that, while there is also a general trend of decreasing EECG of transistor M13 going from DIVIDER 20 to DIVIDER 50, the ratios of EECG remain unchanged throughout DIVIDER 20 to DIVIDER 50 as a single designed value of 1.00 for transistor M13. In fact, a systematic comparison of the EECGs and the ratios of EECG of the rest of the transistors of the typical practice reveals the same observation. It is therefore apparent that, with typical practice, the quantitative design of all the individual building blocks of DIVIDER 60 is essentially similar. It is understood by those skilled in the art that the general trend of decreasing EECG of all transistors going from DIVIDER 20 to DIVIDER 50 is because, as the CLK frequency gets divided down further and further, the lowered speed of circuit operation would only need correspondingly lowered level of operating current with reduced value of EECG to reduce power consumption.

However, referring to the building blocks of the current invention as shown in TABLE-3, which reveals that, while there is a similar general trend of decreasing EECG of transistor Mc1 going from DIVIDER 20 to DIVIDER 50, none of the respective ratios of EECG shares a single designed value common to all the individual building blocks of DIVIDER 60 throughout DIVIDER 20 to DIVIDER 50. Likewise, TABLE-5 reveals that, while there is a general trend of decreasing EECG of transistor M13 going from DIVIDER 20 to DIVIDER 50, none of the respective ratios of EECG of transistor M13 shares a single designed value common to all the individual building blocks of DIVIDER 60 throughout DIVIDER 20 to DIVIDER 50. In fact, a systematic comparison of the EECGs and the ratios of EECG of the rest of the transistors with the current invention reveals the same observation. Therefore, with the current invention, the quantitative designs of each of the individual building blocks of DIVIDER 60 are different from the others. For those skilled in the art, the current invention discloses a unique design feature distinctly different from that known to the typical practice in view of the fact that the current invention requires all the individual building blocks of DIVIDER 60 being designed differently to achieve a much higher level of output signal quality which is otherwise unachievable by the art taught by the typical practice.

TABLE 1E is a tabulated overall design comparison, in terms of the ratio of EECG, between a typical practice and the current invention of the Divide-by-16 DIVIDER 60 as shown in FIG. 2B. It is clearly seen that, while the qualitative design of all the individual building blocks of DIVIDER 60 according to the typical practice is rather similar, the quantitative design of each building block of DIVIDER 60 according to the current invention is different because each of the building blocks needs to be individually adjusted to achieve a much higher level of output signal quality in the presence of such undesirable deteriorating effects like output loading and

TABLE 1E

Overview of Design of EECG for DIVIDER 60

| | TYPICAL PRACTICE | | | | | CURRENT INVENTION | | | |
| --- | --- | --- | --- | --- | --- | --- | --- | --- | --- |
| | RATIO of EECG DIV1 | RATIO of EECG DIV2 | RATIO of EECG DIV3 | RATIO of EECG DIV4 | | RATIO of EECG DIV1 | RATIO of EECG DIV2 | RATIO of EECG DIV3 | RATIO of EECG DIV4 |
| Mc1 | 2.22 | 2.22 | 2.22 | 2.22 | Mc1 | 1.11 | 0.56 | 0.56 | 0.22 |
| Mc2 | 2.22 | 2.22 | 2.22 | 2.22 | Mc2 | 1.11 | 0.56 | 0.56 | 0.22 |
| M1 | 2.00 | 2.00 | 2.00 | 2.00 | M1 | 0.67 | 0.38 | 0.50 | 0.20 |
| M2 | 2.00 | 2.00 | 2.00 | 2.00 | M2 | 0.67 | 0.38 | 0.50 | 0.20 |
| M11 | 2.00 | 2.00 | 2.00 | 2.00 | M11 | 0.67 | 0.38 | 0.50 | 0.20 |
| M12 | 2.00 | 2.00 | 2.00 | 2.00 | M12 | 0.67 | 0.38 | 0.50 | 0.20 |
| M3 | 1.00 | 1.00 | 1.00 | 1.00 | M3 | 2.00 | 1.25 | 1.50 | 0.80 |
| M4 | 1.00 | 1.00 | 1.00 | 1.00 | M4 | 2.00 | 1.25 | 1.50 | 0.80 |
| M5 | 1.00 | 1.00 | 1.00 | 1.00 | M5 | 1.00 | 1.00 | 1.00 | 1.00 |
| M6 | 1.00 | 1.00 | 1.00 | 1.00 | M6 | 1.00 | 1.00 | 1.00 | 1.00 |
| M13 | 1.00 | 1.00 | 1.00 | 1.00 | M13 | 2.00 | 1.25 | 1.50 | 0.80 |
| M14 | 1.00 | 1.00 | 1.00 | 1.00 | M14 | 2.00 | 1.25 | 1.50 | 0.80 |
| M15 | 1.00 | 1.00 | 1.00 | 1.00 | M15 | 1.00 | 1.00 | 1.00 | 1.00 |
| M16 | 1.00 | 1.00 | 1.00 | 1.00 | M16 | 1.00 | 1.00 | 1.00 | 1.00 | interaction between adjacent building blocks. Typically, these effects become especially pronounced at high CLK frequencies such as those for high speed optical communications presented here. Thus, FIG. 3A compares the output signal ripple, DOUT1, between a typical practice and the current invention of the first building block of Divide-by-2 DIVIDER 20 for the Divide-by-16 DIVIDER 60 driven with an INPUT CLOCK 21 of frequency f(CLK)=2.50 GHz. Notice that, while the improvement of signal ripple from FIG. 3A-1 to FIG. 3A-2 seems only visible, upon zooming in as illustrated in FIG. 3A-3, the magnitude of improvement of signal ripple is quite significant from the viewpoint of optical communications. With typical practice, signal ripple 61 has reached 30 mV P—P while with the current invention signal ripple 62 is only 12 mV P—P. This is an important improvement in the data communication industry as it requires that this signal ripple to be as small as possible.

Similarly, FIG. 3B, FIG. 3C and FIG. 3C respectively compares the output signal ripple, DOUT2, DOUT3 and DOUT4, between a typical practice and the current invention of the building blocks of DIVIDER 30, DIVIDER 40 and DIVIDER 50 for the Divide-by-16 DIVIDER 60 driven with an INPUT CLOCK 21 of the same frequency f(CLK)= 2.50 GHz. The following improvement of signal ripple with the current invention are observed:

DIVIDER 30: From 23 mV P—P to 10 mV P—P (FIG. 3B-3, signal ripple 63 vs. signal ripple 64).
DIVIDER 40: From 27 mV P—P to 9 mV P—P (FIG. 3C-3, signal ripple 65 vs. signal ripple 66).
DIVIDER 50: From 83 mV P—P to 10 mV P—P (FIG. 3D-3, signal ripple 67 vs. signal ripple 68).

Figure 4:
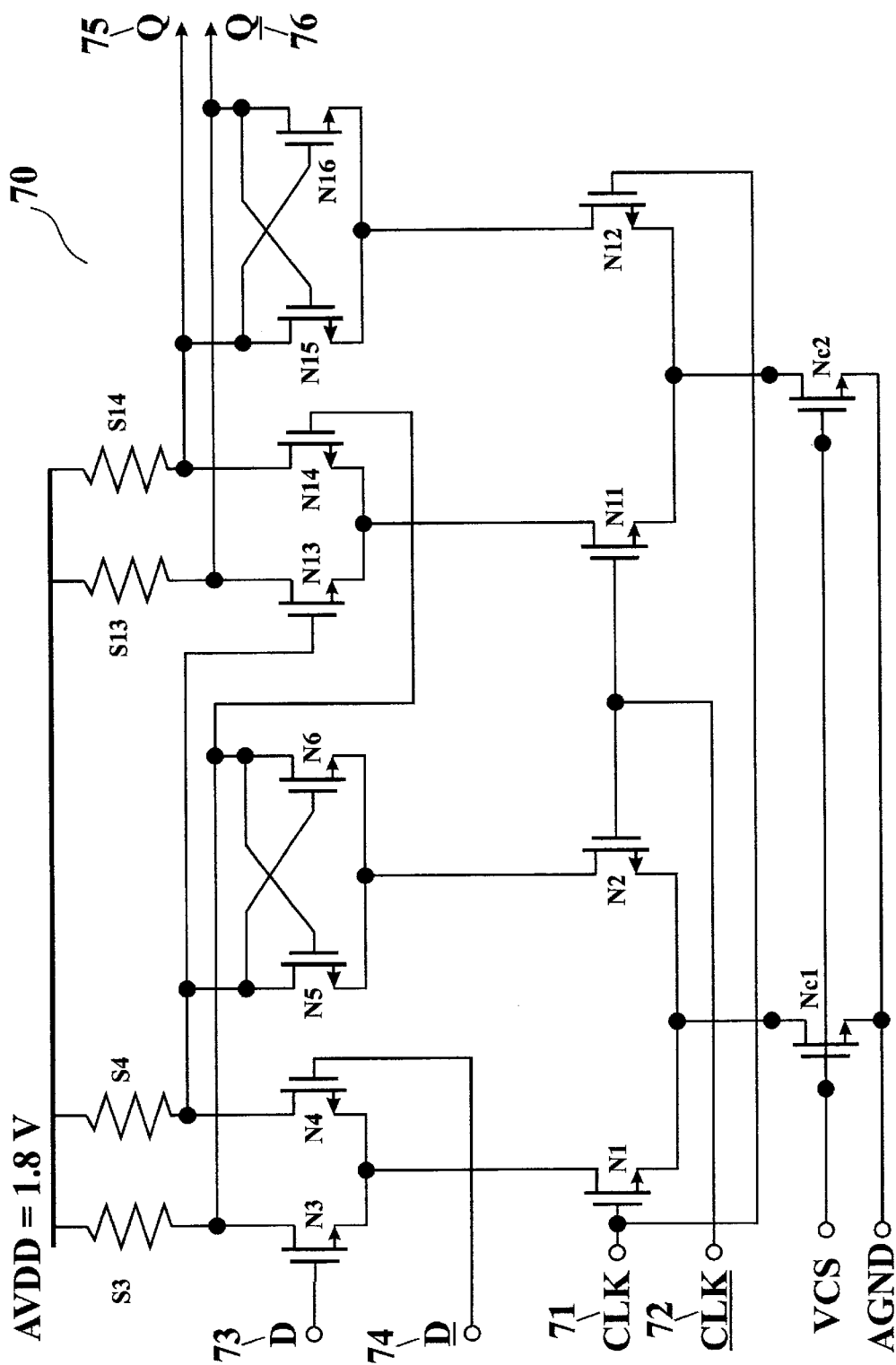
FIG. 4 shows a typical circuit architecture of an MS-DFF with current mode switching.
Figure 5A:
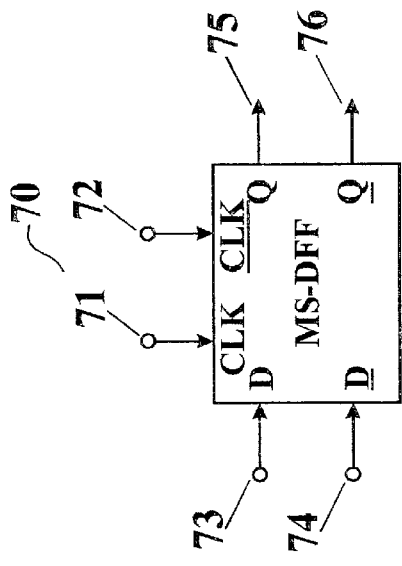
FIG. 5A shows a logic functional block representation of the MS-DFF as shown in FIG. 4.

Another exemplary case of application of the current invention is illustrated from FIG. 4 to FIG. 6. FIG. 4 and FIG. 5A show a typical circuit architecture of an MS-DFF 70 with current mode switching and its associated logic functional block representation. In this exemplary case the supply voltage AVDD is shown to be 1.8 Volt although other values could be used just as well, for example 2.5 Volt. The input clock signals are CLK 71 and CLK 72. The input data signals are D 73 and D 74. The output data signals are Q 75 and Q 76. The various active NMOS transistors are designated as Nc1, Nc2, N1, N2, ..., and N16. The four pull-up resistors are designated S3, S4, S13 and S14. For those skilled in the art, this type of circuitry is also manufacturable with a standard CMOS IC wafer process. If MS-DFF 70 can also be quantitatively designed to provide a high quality signal output at a high CLK frequency, such as 10 GHz for OC-192 communication, then MS-DFF 70 can also be used as one of the fundamental building blocks of a low cost optical switch for an optical network.

Figure 5B:
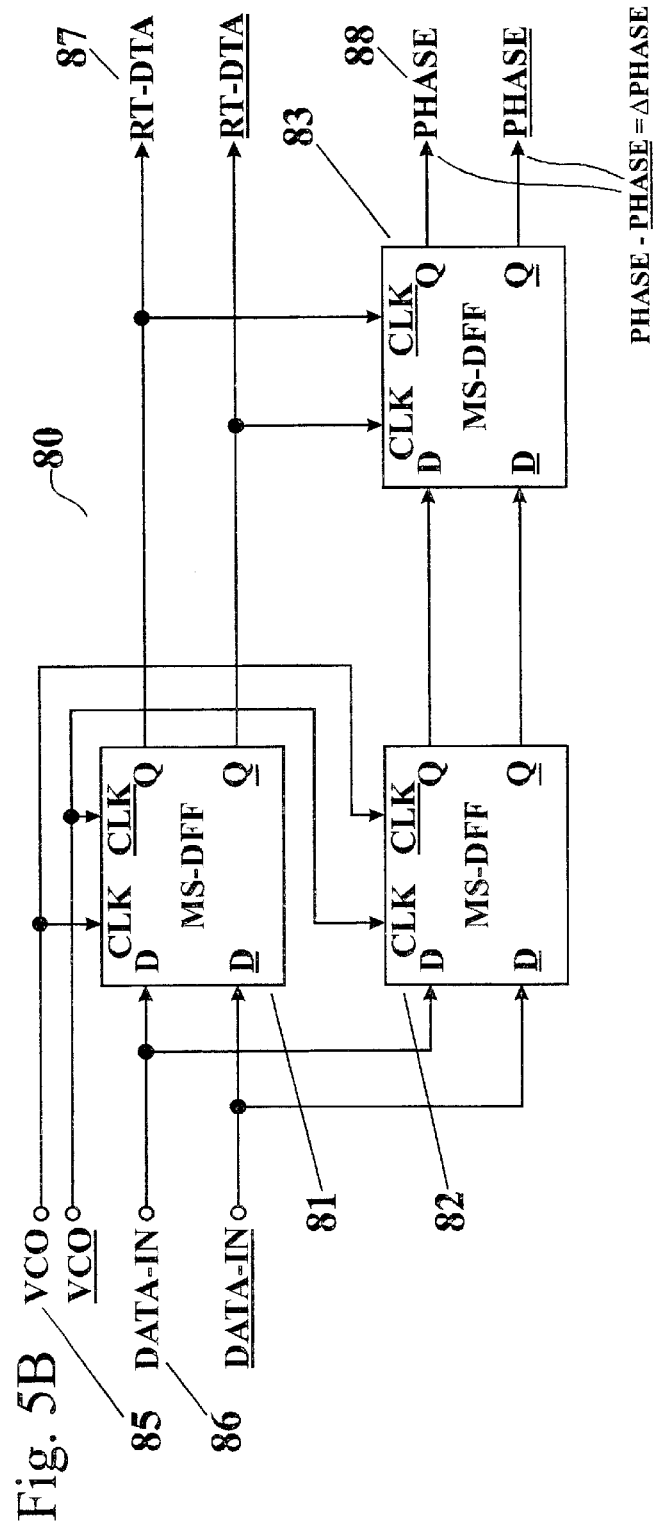
FIG. 5B is a logic functional block diagram of a typical BBPD using the MS-DFF from FIG. 5A as its logic building block.

FIG. 5B is a logic functional block diagram of a typical BBPD 80 using the MS-DFF 70 from FIG. 4 as its logic building block. Specifically, the replicated logic building blocks are labeled as MS-DFF 81, MS-DFF 82 and MS-DFF 83. The input signals include VCO 85 and DATA-IN 86. The output signals include RT-DTA 87 and PHASE 88. For those skilled in the art, it can be easily seen that the logic state of PHASE 88 will change according to the phase relationship of leading or lagging between the two input signals VCO 85 and DATA-IN 86. For convenience, the following differential signal is also defined:

$$\Delta PHASE = PHASE - \underline{PHASE}.$$

Like before, while using the same circuit architecture of an MS-DFF 70 with current mode switching, different quantitative design of BBPD 80 also yields quite different level of output signal quality especially for high VCO frequency as in optical communications. This is illustrated, in a manner similar to the first exemplary case of DIVIDER 60, with TABLE 2A, TABLE 2B, TABLE 2C and TABLE 2D.

TABLE 2A

Design of EECG for MS-DFF 81

| | TYPICAL PRACTICE | | CURRENT INVENTION | |
|---|---|---|---|---|
| | EECG | RATIO of EECG | EECG | RATIO of EECG |
| Nc1 | 120 | 2.22 | Nc1 | 120 | 0.83 |
| Nc2 | 120 | 2.22 | Nc2 | 120 | 0.83 |
| N1 | 108 | 2.00 | N1 | 72 | 0.50 |
| N2 | 108 | 2.00 | N2 | 72 | 0.50 |
| N11 | 108 | 2.00 | N11 | 72 | 0.50 |
| N12 | 108 | 2.00 | N12 | 72 | 0.50 |
| N3 | 54 | 1.00 | N3 | 90 | 0.63 |
| N4 | 54 | 1.00 | N4 | 90 | 0.63 |
| N5 | 54 | 1.00 | N5 | 144 | 1.00 |
| N6 | 54 | 1.00 | N6 | 144 | 1.00 |
| N13 | 54 | 1.00 | N13 | 90 | 0.63 |
| N14 | 54 | 1.00 | N14 | 90 | 0.63 |
| N15 | 54 | 1.00 | N15 | 144 | 1.00 |
| N16 | 54 | 1.00 | N16 | 144 | 1.00 |

TABLE 2B

Design of EECG for MS-DFF 82

| | TYPICAL PRACTICE | | CURRENT INVENTION | |
|---|---|---|---|---|
| | EECG | RATIO of EECG | EECG | RATIO of EECG |
| Nc1 | 120 | 2.22 | Nc1 | 120 | 1.33 |
| Nc2 | 120 | 2.22 | Nc2 | 120 | 1.33 |
| N1 | 108 | 2.00 | N1 | 72 | 0.80 |
| N2 | 108 | 2.00 | N2 | 72 | 0.80 |
| N11 | 108 | 2.00 | N11 | 72 | 0.80 |
| N12 | 108 | 2.00 | N12 | 72 | 0.80 |
| N3 | 54 | 1.00 | N3 | 144 | 1.60 |
| N4 | 54 | 1.00 | N4 | 144 | 1.60 |
| N5 | 54 | 1.00 | N5 | 90 | 1.00 |
| N6 | 54 | 1.00 | N6 | 90 | 1.00 |
| N13 | 54 | 1.00 | N13 | 144 | 1.60 |
| N14 | 54 | 1.00 | N14 | 144 | 1.60 |
| N15 | 54 | 1.00 | N15 | 90 | 1.00 |
| N16 | 54 | 1.00 | N16 | 90 | 1.00 |

TABLE 2C

Design of EECG for MS-DFF 83

| | TYPICAL PRACTICE | | CURRENT INVENTION | |
|---|---|---|---|---|
| | EECG | RATIO of EECG | EECG | RATIO of EECG |
| Nc1 | 120 | 2.22 | Nc1 | 120 | 0.67 |
| Nc2 | 120 | 2.22 | Nc2 | 120 | 0.67 |
| N1 | 108 | 2.00 | N1 | 72 | 0.40 |
| N2 | 108 | 2.00 | N2 | 72 | 0.40 |
| N11 | 108 | 2.00 | N11 | 72 | 0.40 |
| N12 | 108 | 2.00 | N12 | 72 | 0.40 |
| N3 | 54 | 1.00 | N3 | 540 | 3.00 |
| N4 | 54 | 1.00 | N4 | 540 | 3.00 |
| N5 | 54 | 1.00 | N5 | 180 | 1.00 |
| N6 | 54 | 1.00 | N6 | 180 | 1.00 |
| N13 | 54 | 1.00 | N13 | 540 | 3.00 |
| N14 | 54 | 1.00 | N14 | 540 | 3.00 |
| N15 | 54 | 1.00 | N15 | 180 | 1.00 |
| N16 | 54 | 1.00 | N16 | 180 | 1.00 |

TABLE 2D

Overview of Design of EECG for BBPD 80

| | TYPICAL PRACTICE | | | CURRENT INVENTION | | |
|---|---|---|---|---|---|---|
| | RATIO of EECG MS-DFF1 | RATIO of EECG MS-DFF2 | RATIO of EECG MS-DFF3 | RATIO of EECG MS-DFF1 | RATIO of EECG MS-DFF2 | RATIO of EECG MS-DFF3 |
| Nc1 | 2.22 | 2.22 | 2.22 | Nc1 | 0.83 | 1.33 | 0.67 |
| Nc2 | 2.22 | 2.22 | 2.22 | Nc2 | 0.83 | 1.33 | 0.67 |
| N1 | 2.00 | 2.00 | 2.00 | N1 | 0.50 | 0.80 | 0.40 |
| N2 | 2.00 | 2.00 | 2.00 | N2 | 0.50 | 0.80 | 0.40 |
| N11 | 2.00 | 2.00 | 2.00 | N11 | 0.50 | 0.80 | 0.40 |
| N12 | 2.00 | 2.00 | 2.00 | N12 | 0.50 | 0.80 | 0.40 |
| N3 | 1.00 | 1.00 | 1.00 | N3 | 0.63 | 1.60 | 3.00 |
| N4 | 1.00 | 1.00 | 1.00 | N4 | 0.63 | 1.60 | 3.00 |
| N5 | 1.00 | 1.00 | 1.00 | N5 | 1.00 | 1.00 | 1.00 |
| N6 | 1.00 | 1.00 | 1.00 | N6 | 1.00 | 1.00 | 1.00 |
| N13 | 1.00 | 1.00 | 1.00 | N13 | 0.63 | 1.60 | 3.00 |

TABLE 2D-continued

Overview of Design of EECG for BBPD 80

| | TYPICAL PRACTICE | | | | CURRENT INVENTION | | |
| --- | --- | --- | --- | --- | --- | --- | --- |
| | RATIO of EECG MS-DFF1 | RATIO of EECG MS-DFF2 | RATIO of EECG MS-DFF3 | | RATIO of EECG MS-DFF1 | RATIO of EECG MS-DFF2 | RATIO of EECG MS-DFF3 |
| N14 | 1.00 | 1.00 | 1.00 | N14 | 0.63 | 1.60 | 3.00 |
| N15 | 1.00 | 1.00 | 1.00 | N15 | 1.00 | 1.00 | 1.00 |
| N16 | 1.00 | 1.00 | 1.00 | N16 | 1.00 | 1.00 | 1.00 |

Thus, while the quantitative design of all the individual building blocks of BBPD 80 is similar with typical practice, the quantitative design of each building block of BBPD 80 is individually adjusted with the current invention to achieve a much higher level of output signal quality in the presence of such deteriorating effects like output loading and interaction between functionally connected building blocks. Again, these effects tend to become especially pronounced at high VCO frequencies such as those for high speed optical communications presented here.

FIG. 6 compares the output signal ripple, ΔPHASE, between a typical practice and the current invention BBPD 80 with a VCO 85 frequency f(CLK)=2.50 GHz. In FIG. 6A, the magnitude of signal ripple 90 of the typical practice has reached an excessive and obviously unacceptable level of 450 mV P—P in the presence of a logic signal swing of 900 mV. In fact, to filter out such a high level of signal ripple from ΔPHASE, the typical practice would require such a large filter capacitor that, due to its excessive size, needs to be implemented off-chip further increasing the overall system size and cost. With the current invention, the magnitude of signal ripple 91 is now, as shown in FIG. 6B, drastically reduced to about 30 mV which can be easily filtered out, if necessary at all.

Another important remark for the current invention is that, while the preferred embodiments are all illustrated with systematic adjustment of the active NMOS transistors of the individual building blocks, in reality the value of many or all of the associated passive circuit elements are correspondingly adjusted as well. For example, in FIG. 1, the resistors R3, R4, R13 and R14 are all individually adjusted for each building block of DIVIDER 60 in FIG. 2B although these adjustments are not illustrated for simplicity of explanation. For another example, in FIG. 4, the resistors S3, S4, S13 and S14 are all individually adjusted for each building block of BBPD 80 in FIG. 5B although these adjustments are also not illustrated for the same reason.

As described with two exemplary cases, by systematically adjusting the circuit parameter of some or all of the components of the individual building blocks of a system, the corresponding quality of output signal is significantly improved. This is especially important for applications with high clock frequency such as in optical communications where such effects of output loading and interaction between functionally connected building blocks tend to become highly pronounced. The invention has been described using exemplary preferred embodiments. However, for those skilled in this field, the preferred embodiments can be easily adapted and modified to suit additional applications without departing from the spirit and scope of this invention. For example, although not specifically illustrated herein, the same invention can be easily applied to the design a D-type Latch employing emitter-coupled bipolar transistors as the active switching elements with corresponding improvement of signal ringing. Some of the related applications include, but without limitation to, Optical communication at 2.48 Gbit/sec (OC48) and 10 Gbit/sec (OC192) data rate, Gigabit Ethernet, 10 Gigabit Ethernet, Blue Tooth technology (2.4 GHz) and wireless LAN (5.2 GHz). In addition, the electronic circuit system described herein can be used for the design of a plurality of circuits including, but without limitation to, dividers, application specific logic circuit, digital filters, phase detectors, frequency detectors, frequency synthesizers, phase-locked loops, digital-to-analog flash converters, analog-to-digital flash converters, and multi-stage amplifiers. At such a high data rate, the hardware infrastructure for a multimedia information super highway is also enabled.

Thus, it is to be understood that the scope of the invention is not limited to the disclosed embodiments. On the contrary, it is intended to cover various modifications and similar arrangements based upon the same operating principle. The scope of the claims, therefore, should be accorded the broadest interpretations so as to encompass all such modifications and similar arrangements.

We claim:

1. An electronic circuit system manufacturable with a standard CMOS IC wafer process for high speed data transmission up to 10 Gbit/sec data rate, comprising:

a plurality of individually adjustable building blocks wherein each of the building blocks having a similar circuit topology that comprises:

at least a first series of differential pair of transistors, a second series of differential pairs of transistors and a third series of differential pairs of transistors with the first series of differential pair of transistors connected to a ground source, the third series of differential pairs of transistors connected to a power source and the second series of differential pairs of transistors connected in-between in a manner typically of a standard CMOS circuitry;

each of the first series of differential pair of transistors, the second series of differential pairs of transistors, and the third series of differential pairs of transistors is provided with an value of an electrically equivalent channel geometry ("EECG"), defined as a ratio between a channel width and a channel length of the respective pairs of transistors, in which at least the value of EECG of one pair of the third series of differential pairs of transistors is selected to be different from the value of EECG of another pair of the third series of differential pairs of transistors; and each of the first series of differential pair of transistors, the second series of differential pairs of transistors, and the third series of differential pairs of transistors is further assigned with an value of common factor ("CF"), defined as a ratio between the value of EECG of each of the respective pair of transistors and the value of EECG of said another pair of the third series of differential pairs of transistors; and whereby each of the plurality of individually adjustable building blocks is so adjusted to a manner until at least one selected pair of transistors from each of the first series of differential pair of transistors, the second series of differential pairs of transistors, and the third series of differential pairs of transistors of each of the plurality of individually adjustable building blocks do not share an identical value of CF to achieve a desirable output signal with an improved characteristics as compared to an output signal produced by an electronic circuit system having at least one selected pair of transistors from each of the first series of differential pair of transistors, the second series of differential pairs of transistors, and the third series of differential pairs of transistors share an identical value of CF respectively for each of the plurality of individually adjustable building blocks.

2. An electronic circuit system according to claim 1 wherein the improved characteristics for said output signal includes minimizing a deteriorating effect causing by interactions of one or more of the building blocks at the system level.

3. An electronic circuit system according to claim 1 wherein the improved characteristics for said output signal further includes reduction of the level of output signal ripple.

4. An electronic circuit system according to claim 1 wherein the improved characteristics for said output signal further includes reduction of the level of output signal jitter.

5. An electronic circuit system according to claim 1 wherein the improved characteristics for said output signal further includes reduction of the level of output signal oscillation.

6. An electronic circuit system according to claim 1 wherein the improved characteristics for said output signal further includes increasing output signal dynamic range.

7. An electronic circuit system according to claim 1 wherein the improved characteristics for said output signal further includes increasing output signal linearity.

8. An electronic circuit system according to claim 1 wherein the improved characteristics for said output signal further includes increasing accuracy of output signal waveform.

9. An electronic circuit system according to claim 1 wherein the improved characteristics for said output signal further includes increasing accuracy of output signal phase angle.

10. An electronic circuit system according to claim 1 wherein the electronic circuit system is selected from the group consisting essentially of dividers, application specific logic circuit, digital filters, phase detectors, frequency detectors, frequency synthesizers, phase-locked loops, digital-to-analog flash converters, analog-to-digital flash converters, and multi-stage amplifiers.

11. A building block circuit for an electronic circuit system manufacturable with a standard CMOS IC wafer process for high speed data transmission up to 10 Gbit/sec data rate, comprising:

at least a first series of differential pair of transistors, a second series of differential pairs of transistors and a third series of differential pairs of transistors with the first series of differential pair of transistors connected to a ground source, the third series of differential pairs of transistors connected to a power source and the second series of differential pairs of transistors connected in-between in a manner typically of a standard CMOS circuitry; and each of the first series of differential pair of transistors, the second series of differential pairs of transistors, and the third series of differential pairs of transistors is provided with an value of an electrically equivalent channel geometry ("EECG"), defined as a ratio between a channel width and a channel length of the respective pairs of transistors, in which at least the value of EECG of one pair of the third series of differential pairs of transistors is selected to be different from the value of EECG of another pair of the third series of differential pairs of transistors.

12. A method of designing an electronic circuit system manufacturable with a standard CMOS IC wafer process for high speed data transmission up to 10 Gbit/sec data rate, comprising the steps of:

providing a plurality of individually adjustable building blocks wherein each of the building blocks having a similar circuit topology that comprises at least a first series of differential pair of transistors, a second series of differential pairs of transistors and a third series of differential pairs of transistors with the first series of differential pair of transistors connected to a ground source, the third series of differential pairs of transistors connected to a power source and the second series of differential pairs of transistors connected in-between in a manner typically of a standard CMOS circuitry;

identifying an value of an electrically equivalent channel geometry ("EECG"), defined as a ratio between a channel width and a channel length of a pair of transistors for each of the first series of differential pair of transistors, the second series of differential pairs of transistors, and the third series of differential pairs of transistors such that at least the value of EECG of one pair of the third series of differential pairs of transistors is selected to be different from the value of EECG of another pair of the third series of differential pairs of transistors;

assigning an value of common factor ("CF"), defined as a ratio between the value of EECG of each of the respective pairs of transistors and the value of EECG of said another pair of the third series of differential pairs of transistors for each of the first series of differential pair of transistors, the second series of differential pairs of transistors, and the third series of differential pairs of transistors; and adjusting the value of CF for each of the plurality of individually adjustable building until at least one selected pair of transistors from each of the first series of differential pair of transistors, the second series of differential pairs of transistors, and the third series of differential pairs of transistors do not share an identical value of CF to achieve a desirable output signal with an improved characteristics as compared to an output signal produced by an electronic circuit system having at least one selected pair of transistors from each of the first series of differential pair of transistors, the second series of differential pairs of transistors, and the third series of differential pairs of transistors share an identical value of CF respectively for each of the plurality of individually adjustable building blocks.

13. The method of designing an electronic circuit system according to claim 12 wherein the improved characteristics for said output signal includes minimizing a deteriorating effect causing by interactions of one or more of the building blocks at the system level.

14. The method of designing an electronic circuit system according to claim 12 wherein the improved characteristics for said output signal further includes reduction of the level of output signal ripple.

15. The method of designing an electronic circuit system according to claim 12 wherein the improved characteristics for said output signal further includes reduction of the level of output signal jitter.

16. The method of designing an electronic circuit system according to claim 12 wherein the improved characteristics for said output signal further includes reduction of the level of output signal oscillation.

17. The method of designing an electronic circuit system according to claim 12 wherein the improved characteristics for said output signal further includes increasing output signal dynamic range.

18. The method of designing an electronic circuit system according to claim 12 wherein the improved characteristics for said output signal further includes increasing output signal linearity.

19. The method of designing an electronic circuit system according to claim 12 wherein the improved characteristics for said output signal further includes increasing accuracy of output signal waveform.

20. The method of designing an electronic circuit system according to claim 12 wherein the improved characteristics for said output signal further includes increasing accuracy of output signal phase angle.

21. The method of designing an electronic circuit system according to claim 12 wherein the electronic circuit system is selected from the group consisting essentially of dividers, application specific logic circuit, digital filters, phase detectors, frequency detectors, frequency synthesizers, phase-locked loops, digital-to-analog flash converters, analog-to-digital flash converters, and multi-stage amplifiers.

* * * * *